(12) United States Patent
Hirschler et al.

(10) Patent No.: US 8,022,605 B2
(45) Date of Patent: Sep. 20, 2011

(54) ELECTRICAL MULTI-LAYER COMPONENT

(75) Inventors: Michael Hirschler, Graz (AT); Helmut Sommariva, Graz (AT); Peter Stimpfl, Graz (AT)

(73) Assignee: EPCOS AG, Munich (DE)

( * ) Notice: Subject to any disclaimer, the term of this patent is extended or adjusted under 35 U.S.C. 154(b) by 267 days.

(21) Appl. No.: 12/293,042

(22) PCT Filed: Mar. 16, 2007

(86) PCT No.: PCT/DE2007/000488
§ 371 (c)(1),
(2), (4) Date: Nov. 25, 2008

(87) PCT Pub. No.: WO2007/104301
PCT Pub. Date: Sep. 20, 2007

(65) Prior Publication Data
US 2009/0289527 A1    Nov. 26, 2009

(30) Foreign Application Priority Data

Mar. 16, 2006 (DE) .......... 10 2006 012 182
Jul. 5, 2006 (DE) .......... 10 2006 031 085
Jul. 31, 2006 (DE) .......... 10 2006 035 634

(51) Int. Cl.
*H01L 41/08* (2006.01)

(52) U.S. Cl. ....... 310/358; 29/25.35; 252/62.9; 310/328

(58) Field of Classification Search .......... 310/328, 310/363, 364
See application file for complete search history.

(56) References Cited

U.S. PATENT DOCUMENTS

| | | | |
|---|---|---|---|
| 5,196,757 A * | 3/1993 | Omatsu .......... | 310/358 |
| 5,245,734 A * | 9/1993 | Issartel .......... | 29/25.35 |
| 6,366,444 B1 | 4/2002 | Yagi | |
| 7,073,265 B2 | 7/2006 | Senoo et al. | |
| 7,358,655 B2 | 4/2008 | Ragossnig et al. | |
| 7,420,319 B2 * | 9/2008 | Kastl et al. .......... | 310/363 |
| 7,531,947 B2 * | 5/2009 | Shindo et al. .......... | 310/363 |
| 7,745,974 B2 * | 6/2010 | Goat et al. .......... | 310/328 |
| 7,795,789 B2 * | 9/2010 | Schuh .......... | 310/364 |
| 2006/0108898 A1 * | 5/2006 | Sugg .......... | 310/328 |
| 2006/0181178 A1 | 8/2006 | Kastl et al. | |
| 2006/0238073 A1 * | 10/2006 | Ragossnig et al. .......... | 310/328 |
| 2007/0206341 A1 | 9/2007 | Florain et al. | |
| 2009/0015109 A1 | 1/2009 | Schuh | |

FOREIGN PATENT DOCUMENTS

| | | |
|---|---|---|
| DE | 103 07 825 | 9/2004 |
| DE | 102004006777 | 9/2004 |
| DE | 103 45 500 | 4/2005 |

(Continued)

OTHER PUBLICATIONS

International Search Report for PCT/DE2007/000488.

(Continued)

*Primary Examiner* — Mark Budd
(74) *Attorney, Agent, or Firm* — Fish & Richardson P.C.

(57) ABSTRACT

A piezoelectric multi-layer component is described herein. The component includes a plurality of ceramic layers, and one or more electrode layer. The one or more electrode layer has a material structure that is different than the plurality of ceramic layers and is configured to at least partially block a propagation in a longitudinal direction of pressure waves acting on the piezoelectric multi-layer component.

26 Claims, 1 Drawing Sheet

FOREIGN PATENT DOCUMENTS

| | | |
|---|---|---|
| DE | 102005013827 | 11/2005 |
| DE | 102004031402 | 2/2006 |
| DE | 102004031404 | 2/2006 |
| DE | 102005015112 | 10/2006 |
| WO | WO98/05080 | 2/1998 |
| WO | WO2004/077583 | 9/2004 |
| WO | WO2005/034255 | 4/2005 |
| WO | WO2006/000479 | 1/2006 |
| WO | WO2006/103154 | 10/2006 |

OTHER PUBLICATIONS

Written Opinion for PCT/DE2007/000488.
Examination report dated Dec. 5, 2008 from corresponding application DE10 2006 035 634.9.
English translation of Written Opinion for PCT/DE2007/000488.

* cited by examiner

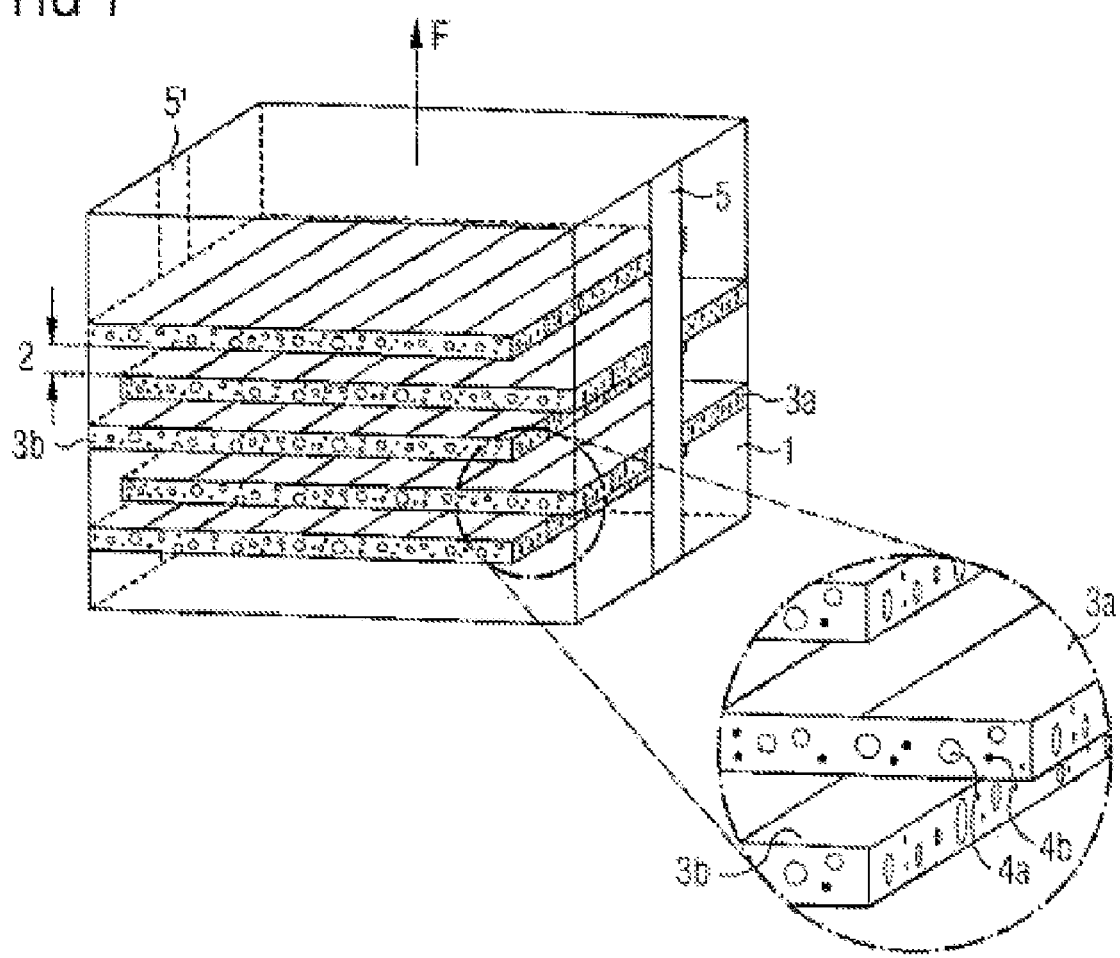

ELECTRICAL MULTI-LAYER COMPONENT

CROSS REFERENCE TO RELATED APPLICATIONS

Pursuant to 35 USC §120, this application claims the benefit PCT/DE2007/000488 filed Mar. 16, 2007 which claims the benefit of German Patent Application No. 102006012182.1 filed Mar. 16, 2006, German Patent Application No. 102006031085.3 filed Jul. 5, 2006, and German Patent Application No. 102006035634.9 filed Jul. 31, 2006. Each of these applications is incorporated by reference in its entirety.

TECHNICAL FIELD

An electrical multi-layer component with an electrode layer blocking the propagation of pressure waves will be described.

BACKGROUND

From WO 2004/077583 A1, an electrical multi-layer component is known, in which a ceramic rupture layer is arranged.

SUMMARY

One task to be achieved consists in creating an alternative electrical multi-layer component, which is insensitive to mechanical stress as much as possible.

An electrical, advantageously piezoelectric multi-layer component with several ceramic layers and electrode layers will be specified, wherein at least one electrode layer has a material structure that is different than the ceramic layers. The propagation of pressure waves acting on the multi-layer component is blocked by means of the electrode layer, in particular, by means of its changed material structure. In particular, the propagation of pressure waves is blocked in the longitudinal direction of the multi-layer component, i.e., perpendicular to the electrode layers.

The term material structure is, in particular, the spatial structure, for example, the grain or crystal structure, as well as that of intermediate spaces between solid bodies within the electrode layer, wherein the material structure does not require the use of certain, in particular, ceramic materials.

According to one embodiment of the multi-layer component, the electrode layer has a boundary surface effect relative to the pressure waves, wherein this effect blocks the propagation of pressure waves. A boundary surface effect is understood to be the behavior of a pressure wave when it enters from a medium of first density into a medium of second density. In this way, the properties of the pressure wave are changed, e.g., their shape and/or their type of propagation. The change in wave properties could be exhibited by a change in amplitude, deflection, distortion, or refraction.

The pressure wave can originate from impact energy, shock energy, vibration energy, or some other mechanical energy acting on the multi-layer component.

The propagation-blocking effect can be produced both within the electrode layer and also at the boundary surface between the electrode layer and an adjacent ceramic or piezoelectric layer.

In particular, the electrode layer causes absorption, refraction, diffusion, deflection, or damping of the pressure waves or the incoming mechanical energy.

According to one embodiment, in particular, the boundary surface effect causes absorption, refraction, diffusion, damping, or also deflection of the pressure waves in or at the electrode layers.

According to one embodiment, the multi-layer component has several ceramic layers and electrode layers, wherein at least one electrode layer comprises an absorption function. Here, this electrode layer can feature smaller mechanical stability, different density, and/or different compressibility or elasticity than the surrounding ceramic layers. The electrode layer here can comprise, in addition to other described effects, predominantly or completely an absorption function against the propagation of mechanical energy or pressure waves through the multi-layer component.

In addition, an electrical, in particular, piezoelectric multi-layer component will be specified, which has several ceramic layers and electrode layers, wherein at least one electrode layer has a material structure, which is changed relative to the ceramic layers and which lowers the mechanical tensile strength of the electrode layer below that of the surrounding ceramic. Here, the region of reduced tensile strength can be constructed as a region of the electrode layer comprising a rupture function or can have a rupture point, wherein the rupture point forms a controlled crack running essentially parallel to the electrode layers starting at a certain tensile load.

According to one embodiment of the electrode layer with lowered tensile strength, the electrode layer contains a ceramic material, which lowers the tensile strength of the electrode layer relative to the surrounding ceramic layers.

Alternatively or additionally, the electrode layer contains, according to one embodiment, a ceramic material, which lowers the mechanical tensile strength of the boundary surface between the electrode layer and the surrounding ceramic below that of the surrounding ceramic. Here, it can also involve a rupture function or a rupture point of the electrode layer.

Apart from the use of a certain ceramic material for reducing the tensile strength of the electrode layer, this can have a material structure, such that, under mechanical loading, a crack running essentially parallel to the electrode layer propagates in the electrode layer.

In particular, it was recognized, namely, that piezoelectric multi-layer actuators are especially sensitive to the supply of mechanical energy in the form of impact energy, sound energy, and vibration energy, and that in this way, when there is over-extension, the piezoelectric multi-layer actuators tend to form cracks in an uncontrolled way that destroys components. However, it was also observed that this crack formation has no negative influence on the properties and service life of the multi-layer component, when it runs parallel to the electrodes.

The proposed electrical multi-layer component now has the advantage that a crack is formed within the electrode layer essentially parallel to the planes of the electrode layers or the ceramic layers due to a rupture point created with or at the electrode layer. However, it is also possible that the electrical multi-layer component remains completely crack-free under mechanical stress due to at least partial absorption of the mechanical energy through the electrode layers.

According to one embodiment, the electrode layer comprises both an absorption function and also a rupture function. Here, the electrode layer blocks pressure waves up to a certain intensity, in that the layer at least partially absorbs the waves, but acts as a rupture point when the intensity is exceeded. The certain intensity is here directed toward the operating conditions of the multi-layer component; for example, depends on the operating temperature, the time of the loading, or the continuous loading of the multi-layer component, as well as the frequency of the loading with an electric field.

Through the electrode layer described here with a changed material structure or comprising an absorption layer and/or a rupture point, the multi-layer component can also be used for a longer time at a higher energy input. This also has the advantage that, for a device inserting the multi-layer component, for example, an injection device, the multi-layer component, when it involves a piezoelectric multi-layer component, must be replaced less frequently or the usability of the affected device is prolonged. Here, among other things, complicated and expensive maintenance work can be spared.

Electrode layers of a multi-layer component described here have the function of internal electrodes and are used for establishing an electric field in the ceramic layers adjacent to the electrode layers. Thus, they advantageously have both an electric, field-building function and also a mechanical stability function for the multi-layer component, by means of which the spatial dimensions of the component can be held as small as possible.

According to one embodiment of the electric multi-layer component, the electrode layer can be designed as a region with changed density and thus elasticity or compressibility in the multi-layer component. This region should deflect pressure or sound waves and should absorb vibration energy. Here, the electrode layer could have a lower density and/or higher compressibility than surrounding ceramic layers.

An electrode layer acting as an absorption layer completely, predominantly, at least partially, or temporarily has the advantage that for a quick succession of several mechanical impacts on the multi-layer component, a continuous propagation of the resulting mechanical impact waves can be effectively reduced also through reflection at the outer ends of the component. The electrode layer is also shaped so that, for example, impact waves running through the component at the speed of sound, experience diffraction or refraction at boundary surfaces between an electrode layer and another layer, for example, a ceramic layer, by means of which the straight-line propagation of the impact wave is weakened. Therefore, high oscillation or accumulating bundles of impact waves caused by mechanical impacts in quick succession can be reduced in terms of their intensity and the risk of destruction of the multi-layer component can be reduced.

The electrical multi-layer component is advantageously a piezoelectric multi-layer actuator, whose ceramic includes a piezoceramic, advantageously a PZT ceramic.

For producing the electrical multi-layer component, advantageously no additional steps are required than those that are necessary for the production of an electrical multi-layer component having no electrode layer with an additional function. This is achieved in that, for example, no additional layer separated from the electrode layer and the ceramic layers has to be created, which would have changed dimensions, in particular, enlarged dimensions of the electrical multi-layer component as a result. The electrode layer is produced in one and the same processing step together with its property, protecting the multi-layer component from mechanical stress.

According to one embodiment of the electrical multi-layer component, at least one electrode layer contains an additive of a material, which lowers the mechanical tensile strength of the electrode layer relative to that of the ceramic layers. It is favorable when it involves ceramic additives. The ceramic additives can here contain the same material as the ceramic layers. Other materials that have the mentioned effect, however, can also be used.

The ceramic additive is advantageously created such that it weakens the material structure of the electrode layer so much that the mechanical tensile strength is lower than that of the surrounding ceramic.

The ceramic additive can additionally or alternatively change the density or the compressibility of the electrode layer so much that this acts as an absorption layer. In the production of the electrical multi-layer component, the ceramic additive can be added in the same production step as in that of the electrode layer, so that advantageously no other production step is necessary.

According to one embodiment of the electrical multi-layer component, ceramic material, advantageously, ceramic grains, whose sizes differ from each other by a multiple, is added to the electrode layers. Here, advantageously a mixture from only coarse or coarse and fine grains in comparison with surrounding ceramic layers is selected.

The mechanical tensile strength in the region or within an electrode layer can be equal to or greater than that of the surrounding ceramic due to the diffusion of material during the sintering of the multi-layer component. This strength could be increased even more through the addition of finely ground ceramic, in order to spare a required quantity of relatively expensive electrode material or to favor the use of low melting point alloys as the electrode layer.

Nevertheless, it is proposed to achieve a strength or density that is favorable for a rupture point or absorption layer through an addition of a coarse ceramic or a ceramic that differs from that of the ceramic layers. However, the addition does not exclude the simultaneous use of finely ground ceramic for the mentioned purpose and also does not destroy the electrical conductivity required for the functioning of the electrode layer.

According to one embodiment of the electrical multi-layer component, the ceramic additives comprise mixtures made from zirconium oxide and titanium oxide. In principle, however, other ceramic additives can be used, which form a material structure that is changed relative to the surrounding ceramic. The mixtures can here have fine and coarse grains in selected percentages or in a bimodal grain size distribution. Such a bimodal grain size distribution of the ceramic additive here allows the formation of the electrode of the electrode layer through the effect of the fine grain with reduced metal requirements and/or changed alloy ratio, for example, an alloy with a reduced percentage of palladium, but also simultaneously the formation of a mechanically weakened point or a point blocking the propagation of pressure waves, for example, for forming a predetermined breaking point, due to the presence of the coarse grain or foreign grain.

If a rupture point of an electrode layer is under mechanical stress in such a way that it forms cracks, through the ceramic additives, in the worst case the formation of cracks of first degree is possible, wherein cracks of the first degree prevent, on their side, the creation of cracks of second degree.

A crack of first degree is here to be understood in that it negatively affects the functionality of the electrical multi-layer component not at all or only to an extremely minimal degree. Here, it runs essentially parallel to an electrode layer.

A crack of second degree is here one that can lead directly to the failure of the component, for example, in that, through splitting of a dielectric or ceramic layer, it creates an electrical path that, on its side, could cause a short circuit between different electrical poles or differently poled electrode layers of the component. Cracks of second degree could run, for example, perpendicular to the planes of the ceramic and electrode layers. They are avoided through the creation of cracks of first degree, in that small fragments are produced in the electrode layer due to cracks of first degree and thus mechanical stress within this layer is released in such a way that no additional cracks can be created even under additional mechanical stress.

The electrical multi-layer component is advantageously provided with lead wire or at its surface with external contacts that contact the electrode layers.

Due to its increased mechanical stability, the electrical multi-layer component can be used in devices that can be subjected to mechanical oscillations, such as, for example, engines or driving mechanisms. Here, in particular, gasoline, kerosene, or diesel engines for motor vehicles or airplanes or trains can be considered.

Also, an injection device will be specified, which has the piezoelectric multi-layer component. Here, the piezoelectric multi-layer component could be connected at one end mechanically to a valve or to a valve pin and could be mounted rigidly or almost rigidly on the other end.

DESCRIPTION OF THE DRAWINGS

The described subject matter will be explained in more detail with reference to the following FIGURE and embodiments. Shown herein are:

FIG. 1, an electrical multi-layer component with electrode layers, which contain a ceramic additive.

DETAILED DESCRIPTION

FIG. 1 shows an electrical multi-layer component 1, which has a plurality of ceramic layers 2 arranged one above the other. The ceramic layers are arranged along a longitudinal axis, which is shown with an arrow. Between the ceramic layers there are electrode layers 3a, 3b. In at least one electrode layer 3a or 3b, there is a region blocking the propagation of pressure waves in the longitudinal direction of the multi-layer component. This is enabled here by the presence of ceramic additives in the electrode layer.

The electrode layers 3a and 3b advantageously contain a certain ceramic additive, which is made from both coarse 4a and also fine 4b ceramic grains.

The electrode layers 3a belong to one electrical pole of the multi-layer component and the electrode layers 3b belong to the other pole of the component. The electrode layers 3a led completely up to the right edge of the component are connected to each other in an electrically conductive way by the external contact 5.

Analogously, the electrode layers 3b reaching up to the outer edge on the left side of the component are connected in an electrically conductive way with an external contact 5' arranged on the left side of the component.

Advantageously, the component 1 is created by sintering a stack of ceramic green sheets arranged one above the other and electrode layers arranged in-between. In this way, a monolithic multi-layer component is created.

To further reduce the maximum stress of the component through the mechanical vibrations, it can be provided that electrode layers, which block pressure waves or which act as rupture layers and which can each contain ceramic additives, are provided at several positions of the longitudinal axis. These are constructed in such a way that, under mechanical stress, they form only cracks of first degree.

With such electrode layers, the component is divided into several sub-components, wherein each sub-component can be considered separately with respect to the loading due to the mechanical stress. In this way, mechanical vibrations or tensile stress can no longer add up over the entire length of the piezoelectric multi-layer component and thus lead to uncontrolled cracks in the component.

If the electrical multi-layer component has n electrode layers of the described type 3a, 3b, it was divided into k regions, in each of which mechanical stress can build up, wherein k>n−1. The k regions correspond to the ceramic layers 2 located next to an electrode layer. Each of these regions, however, is so narrow or small that for each region, only small mechanical stress can be produced, which can be immediately dissipated at an adjacent electrode layer by means of its boundary surface effect or its absorption effect or in case the electrode layer involves a rupture layer, by means of mechanical breakage.

The distribution of the electrode layers 3a and 3b can thus be selected uniformly along the longitudinal axis of the multi-layer component in such a way that sub-components are created, whose height is so strongly reduced that the tensile stress occurring in normal operation or at poles of the piezo-actuator can no longer generate cracks in the component outside of the rupture points or absorption layers.

If the multi-layer component should also have several electrode layers 3a, 3b of the named type, so that several piezo-electric multi-layer component parts are formed in this way, then for a height of the piezoelectric multi-layer component of 30 mm, this could be divided into 10 parts by 9 electrode layers with rupture points, wherein each part has a height of 3 mm.

The electrode layers 3a, 3b can contain silver, palladium, or copper, as well as an alloy of several of these materials.

The invention claimed is:

1. A piezoelectric multi-layer component comprising:
a plurality of ceramic layers, and
one or more electrode layers having a material structure that is different than the plurality of ceramic layers and is configured to at least partially block a propagation in a longitudinal direction of pressure waves acting on the piezoelectric multi-layer component, the one or more electrode layers including ceramic additives having both fine grains and coarse grains in a bimodal grain size distribution.

2. The piezoelectric multi-layer component of claim 1, wherein the one or more electrode layers are configured to exert one or more effects selected from the group consisting of absorption, refraction, diffusion and deflection on the pressure waves.

3. The piezoelectric multi-layer component of claim 1, wherein the pressure waves are generated by one or more of impact energy, shock energy, sound energy, or vibration energy.

4. The piezoelectric multi-layer component of claim 1, wherein:
the one or more electrode layers comprise a ceramic material having a first density;
the plurality of ceramic layers comprise a material having a second density; and
the one or more electrode layers are at least partially surrounded by the plurality of ceramic layers, the ceramic material changing the first density relative to the second density of the surrounding ceramic layers such that the multi-layer component is configured to absorb, refract, deflect or diffuse the pressure waves acting on the multi-layer component.

5. The piezoelectric multi-layer component of claim 1, wherein:
the one or more electrode layers comprise a ceramic material having a first compressibility;

the plurality of ceramic layers comprise a material having a second compressibility; and the one or more electrode layers are at least partially surrounded by the plurality of ceramic layers, the ceramic material changing the first compressibility relative to the second density of the surrounding ceramic layers such that the multi-layer component is configured to absorb, refract, deflect or diffuse the pressure waves acting on the multi-layer component.

6. The piezoelectric multi-layer component of claim 1, wherein the one or more electrode layers comprise a ceramic material in a mixture of zirconium oxide and titanium oxide.

7. The piezoelectric multi-layer component of claim 1, wherein the one or more electrode layers comprise coarse ceramic grains.

8. The piezoelectric multi-layer component of claim 1, wherein the one or more electrode layers comprise a mixture of coarse and fine ceramic grains.

9. The piezoelectric multi-layer component of claim 1, wherein the one or more electrode layers comprise a ceramic material different from zirconium oxide and titanium oxide.

10. The piezoelectric multi-layer component of claim 1, wherein the one or more electrode layers comprise a silver-palladium alloy.

11. The piezoelectric multi-layer component of claim 1, wherein the one or more electrode layers comprise copper.

12. The piezoelectric multi-layer component of claim 1, wherein the one or more electrode layers are stacked in an alternating configuration and are electrically contacted with different external connections.

13. The piezoelectric multi-layer component of claim 1, wherein:

the piezoelectric multi-layer component has a height; and
the one or more electrode layers are distributed over the height of the piezoelectric multi-layer component.

14. The piezoelectric multi-layer component of claim 13, wherein the one or more electrode layers comprise regular spacings relative to each other, each spacing being formed by a plurality of ceramic layers.

15. The piezoelectric multi-layer component of claim 1, wherein the plurality of ceramic layers comprise a mixture of lead, zirconate, and titanate.

16. A piezoelectric multi-layer component, comprising:

a plurality of ceramic layers having a first mechanical tensile strength; and
one or more electrode layers at least partially surrounded by the plurality of ceramic layers and having a material structure having a second mechanical tensile strength, the one or more electrode layers including ceramic additives having both fine grains and coarse grains in a bimodal grain size distribution,
wherein the material structure is changed relative to the plurality of ceramic layers and reduces the second mechanical tensile strength to less than the first mechanical tensile strength.

17. The piezoelectric multi-layer component of claim 16, wherein:

the plurality of ceramic layers have a first mechanical tensile strength; and
the one or more electrode layers surrounded by the plurality of ceramic layers have a second mechanical tensile strength and a ceramic material, wherein the ceramic material reduces the second mechanical tensile strength to less than the first mechanical tensile strength.

18. The piezoelectric multi-layer component of claim 16, further comprises an electrode-ceramic boundary surface having a third mechanical tensile strength, wherein the ceramic material reduces the third mechanical tensile strength of the electrode-ceramic boundary surface to less than the first mechanical tensile strength.

19. The piezoelectric multi-layer component of claim 16, wherein the one or more electrode layers are configured to provide a rupture point under mechanical loading.

20. The piezoelectric multi-layer component of claim 16, wherein, under mechanical loading, the electrode layers are configured to generate a crack within one of the electrode layers parallel to the one or more electrode layers.

21. The piezoelectric multi-layer component of claim 16, wherein the one or more electrode layers comprise a ceramic material in a mixture of zirconium oxide and titanium oxide.

22. The piezoelectric multi-layer component of claim 16, wherein the one or more electrode layers comprise coarse ceramic grains.

23. The piezoelectric multi-layer component of claim 16, wherein the one or more electrode layers comprise a mixture of coarse and fine ceramic grains.

24. The piezoelectric multi-layer component of claim 16, wherein the one or more electrode layers comprise a ceramic material different from zirconium oxide and titanium oxide.

25. The piezoelectric multi-layer component of claim 1, wherein the one or more electrode layers comprise metallic additives in a form of coarser grains.

26. The piezoelectric multi-layer component of claim 16, wherein the one or more electrode layers comprise metallic additives in a form of coarser grains.

* * * * *

UNITED STATES PATENT AND TRADEMARK OFFICE
CERTIFICATE OF CORRECTION

PATENT NO.      : 8,022,605 B2                                    Page 1 of 1
APPLICATION NO. : 12/293042
DATED           : September 20, 2011
INVENTOR(S)     : Michael Hirschler et al.

It is certified that error appears in the above-identified patent and that said Letters Patent is hereby corrected as shown below:

Claim 25, Column 8, Line 44 – delete "coarser" and insert -- coarse --, therefor.

Claim 26, Column 8, Line 47 – delete "coarser" and insert -- coarse --, therefor.

Signed and Sealed this

Eighth Day of November, 2011

David J. Kappos
*Director of the United States Patent and Trademark Office*